(12) United States Patent
Gabara

(10) Patent No.: US 7,194,052 B2
(45) Date of Patent: Mar. 20, 2007

(54) DATA CAPTURE CIRCUIT WITH SELF-TEST CAPABILITY

(75) Inventor: Thaddeus John Gabara, Murray Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 1045 days.

(21) Appl. No.: 09/947,684

(22) Filed: Sep. 6, 2001

(65) Prior Publication Data
US 2003/0043748 A1 Mar. 6, 2003

(51) Int. Cl.
*H04L 7/00* (2006.01)
(52) U.S. Cl. .................................. 375/355
(58) Field of Classification Search ............ 375/354, 375/355, 377, 359, 362, 224, 226; 340/825, 340/5.63, 5.61, 5.6, 5.2, 5.1; 370/395.62, 370/395.61, 6, 395.1, 389, 351, 395.6
See application file for complete search history.

(56) References Cited

U.S. PATENT DOCUMENTS 5,729,550 A * 3/1998 Nakajima et al. ............ 714/704
6,493,408 B1 * 12/2002 Kobayashi .................. 375/357

OTHER PUBLICATIONS

U.S. Appl. No. 09/374,258, filed Aug. 13, 1999, T.J. Gabara et al., "Signal Processing Method and Apparatus For Ensuring a Desired Relationship Between Signals."
T. Xanthopoulos et al., "The Design and Analysis of the Clock Distribution Network for a 1.GHz Alpha Microprocessor," ISSCC 2001, 2 pages, Feb. 2001.

* cited by examiner

*Primary Examiner*—Pankaj Kumar

(57) ABSTRACT

A data capture circuit having a self-test capability includes a first data capture element to be tested in a self-test mode of operation, at least one additional data capture element, e.g., a second data capture element that is a substantial duplicate of the first, a clock generator circuit, a controller and a comparison circuit. The clock generator circuit is configured to generate a clock signal for application to clock inputs of the data capture elements, and a number of selectable clock-based test data signals. In the test mode, the controller selects at least a particular one of the test data signals for application to a data input of the first data capture element. A delayed version of the selected test data signal is applied to a data input of the second data capture element. The comparison circuit is configured to compare output signals generated by the first and second data capture elements, and supplies a result of the comparison back to the controller. The controller repeats the selection of particular test data signals and monitors corresponding comparison results until set-up and hold times or other clocking characteristics of the first data capture element are determined to a desired level of accuracy.

15 Claims, 4 Drawing Sheets

DATA CAPTURE CIRCUIT WITH SELF-TEST CAPABILITY

FIELD OF THE INVENTION

The present invention relates generally to electronic data capture circuits, such as circuits which include one or more flip-flops, memory cells or input latches, and more particularly to techniques for measuring the ability of such circuits to capture data.

BACKGROUND OF THE INVENTION

As is well known, data capture circuits are commonly used in a wide variety of integrated circuit applications. A significant drawback of conventional data capture circuits is the difficulty associated with measuring the ability of such circuits to capture data. For example, flip-flops, memory cells, latches and other data capture elements of such circuits often have minimum requirements for set-up and hold times. The set-up time refers generally to the period of time that the data must maintain a particular logic level at a circuit input prior to clocking, while the hold time refers to the amount of time that the data must remain at the particular level at the circuit input after clocking. The minimum requirements for the set-up and hold times must be satisfied in order for the particular data level to be reliably captured by the circuit.

In accordance with conventional techniques, the minimum set-up and hold time requirements are typically measured using specialized test equipment. Unfortunately, such test equipment can be expensive, and the time associated with the test process itself further increases the cost of circuit design, development and manufacturing. In addition, even the most sophisticated conventional test equipment has only limited accuracy, e.g., may be able to determine the minimum set-up and hold time requirements for a given data capture circuit only down to an accuracy of about +/−150 picoseconds. In many applications, it would be desirable to determine the set-up and hold time requirements to an accuracy of about +/−10 or +/−20 picoseconds, but as indicated above, the conventional test equipment is unable to provide this accuracy.

It is also known in the art to configure certain types of data capture circuits so as to be less sensitive to variations in data signal transitions. Examples of such techniques are described in U.S. patent application Ser. No. 09/374,258 filed Aug. 13, 1999 in the name of inventors T. J. Gabara et al. and entitled "Signal Processing Method and Apparatus For Ensuring a Desired Relationship Between Signals," which application is commonly assigned herewith and incorporated by reference herein. However, these techniques do not adequately address the data capture measurement issues identified above.

A need therefore exists for an improved data capture circuit which eliminates the problems associated with conventional specialized test equipment, while providing enhanced accuracy for measurement of minimum set-up and hold time requirements.

SUMMARY OF THE INVENTION

The present invention meets the above-identified need by providing a data capture circuit having a self-test capability.

In accordance with one aspect of the invention, a data capture circuit having a self-test capability includes a first data capture element to be tested in a self-test mode of operation, at least one additional data capture element, a clock generator circuit, a controller and a comparison circuit. The additional data capture element is preferably a duplicate of the first, e.g., a second data capture element having substantially the same configuration, performance and parameters as the first data capture element. The clock generator circuit is configured to generate a clock signal for application to clock inputs of the data capture elements, and a number of selectable clock-based test data signals. In the test mode, the controller selects at least a particular one of the test data signals for application to a data input of the first data capture element. A delayed version of the selected test data signal is applied to a data input of the second data capture element. The comparison circuit is configured to compare output signals generated by the first and second data capture elements, and supplies a result of the comparison back to the controller. The controller repeats the selection of particular test data signals and monitors corresponding comparison results until set-up and hold times or other clocking characteristics of the first data capture element are determined to a desired level of accuracy.

The data capture circuit in an illustrative embodiment of the invention operates in a first mode in which the self-test capability is activated for application of the selected test data signal and the delayed version thereof to the respective first and second data capture elements, and a second mode in which the self-test capability is deactivated and a data signal is captured by at least one of the first and the second data capture elements.

The clock generator circuit may be implemented as a delay lock loop (DLL) having a first output corresponding to the clock signal, and a plurality of additional outputs each corresponding to one of the plurality of selectable clock-based test data signals. The selectable clock-based test data in an illustrative embodiment include 2n+1 versions of a divided-by-two clock signal, each having a different amount of delay associated therewith. The controller may be implemented as a finite state machine (FSM).

In accordance with another aspect of the invention, the data capture circuit may further include a controllable delay element, with the controllable delay element having a first input for receiving the selected test data signal, a second input for receiving a control signal from the controller, and an output corresponding to the delayed version of the test data signal.

In accordance with a further aspect of the invention, the selectable clock-based test data signals may be applied to corresponding inputs of each of a first multiplexer and a second multiplexer. Each of the multiplexers may have a control signal input coupled to a corresponding output of the controller, with the controller selecting a particular one of the test data signals by application of a first control signal to the control signal input of the first multiplexer, and selecting the delayed version of the selected test data signal by application of a second control signal to the control signal input of the second multiplexer.

In accordance with yet another aspect of the invention, the data capture circuit includes an exclusive-or gate or other logic gate and a third data capture element. The logic gate has a first input adapted to receive the output signal generated by the first data capture device and a second input adapted to receive the output signal generated by the second data capture device. The third data capture element has a data input coupled to an output of the logic gate, and is configured to clock data on a falling edge of the clock signal.

Advantageously, the present invention allows minimum set-up and hold time requirements of a given data capture circuit to be measured to an accuracy of about +/−10 or +/−20 picoseconds, and without the expense, delay and other difficulties associated with conventional specialized test equipment. In addition, as a result of the increased accuracy, the data capture circuit may be permitted to operate with lower set-up and hold times than would otherwise be possible.

DETAILED DESCRIPTION OF THE INVENTION

The present invention will be illustrated herein using exemplary data capture circuits. It should be understood, however, that the invention is more generally suitable for use in any data capture application in which it is desirable to provide improved performance in terms of avoiding clocking-related problems such as violation of set-up and hold times. The term "data capture circuit" as used herein is intended to include any circuit having one or more data capture elements. The term "data capture element" is intended to include a flip-flop, memory cell, latch circuit or any other type of circuit or circuit element capable of capturing data.

Figure 1:
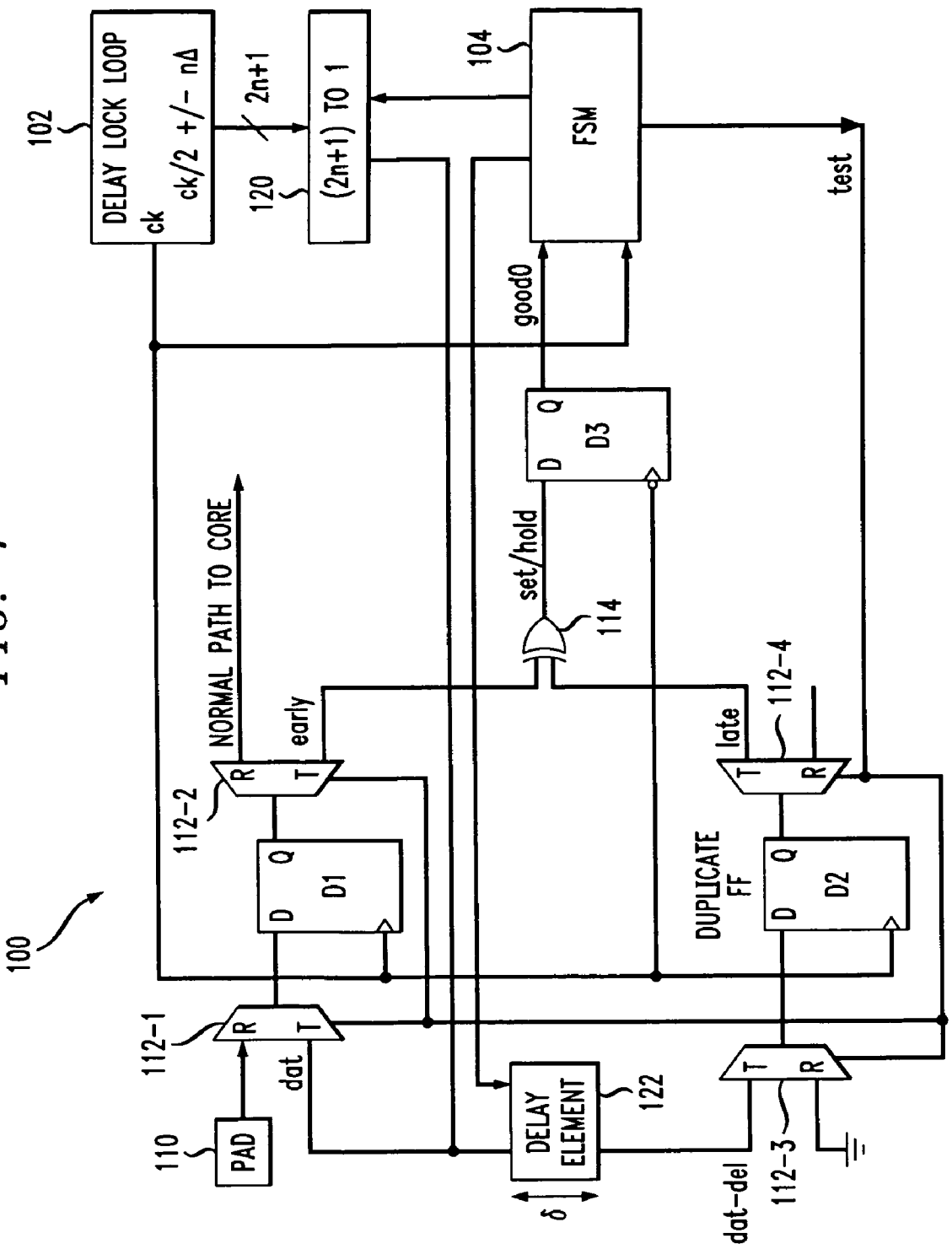
FIG. 1 shows a data capture circuit with self-test capability in accordance with a first illustrative embodiment of the invention.

FIG. 1 shows a data capture circuit 100 with self-test capability in accordance with a first illustrative embodiment of the invention. The data capture circuit 100 in this embodiment includes three data capture elements in the form of D-type flip-flops D1, D2 and D3, a delay lock loop (DLL) 102, a finite state machine (FSM) 104, an input pad 110, four 2-to-1 multiplexers 112-1, 112-2, 112-3 and 112-4, an exclusive-or (XOR) gate 114, a (2n+1)-to-1 multiplexer 120, and a controllable delay element 122 providing a controllable amount of delay δ.

In this embodiment, the flip-flop D1 is a data capture device for which minimum set-up and hold times are to be determined using the self-test capability of the circuit 100. The flip-flop D2 is preferably a duplicate of the flip-flop D1, i.e., a flip-flop having substantially the same configuration, performance and parameters.

Figure 2:
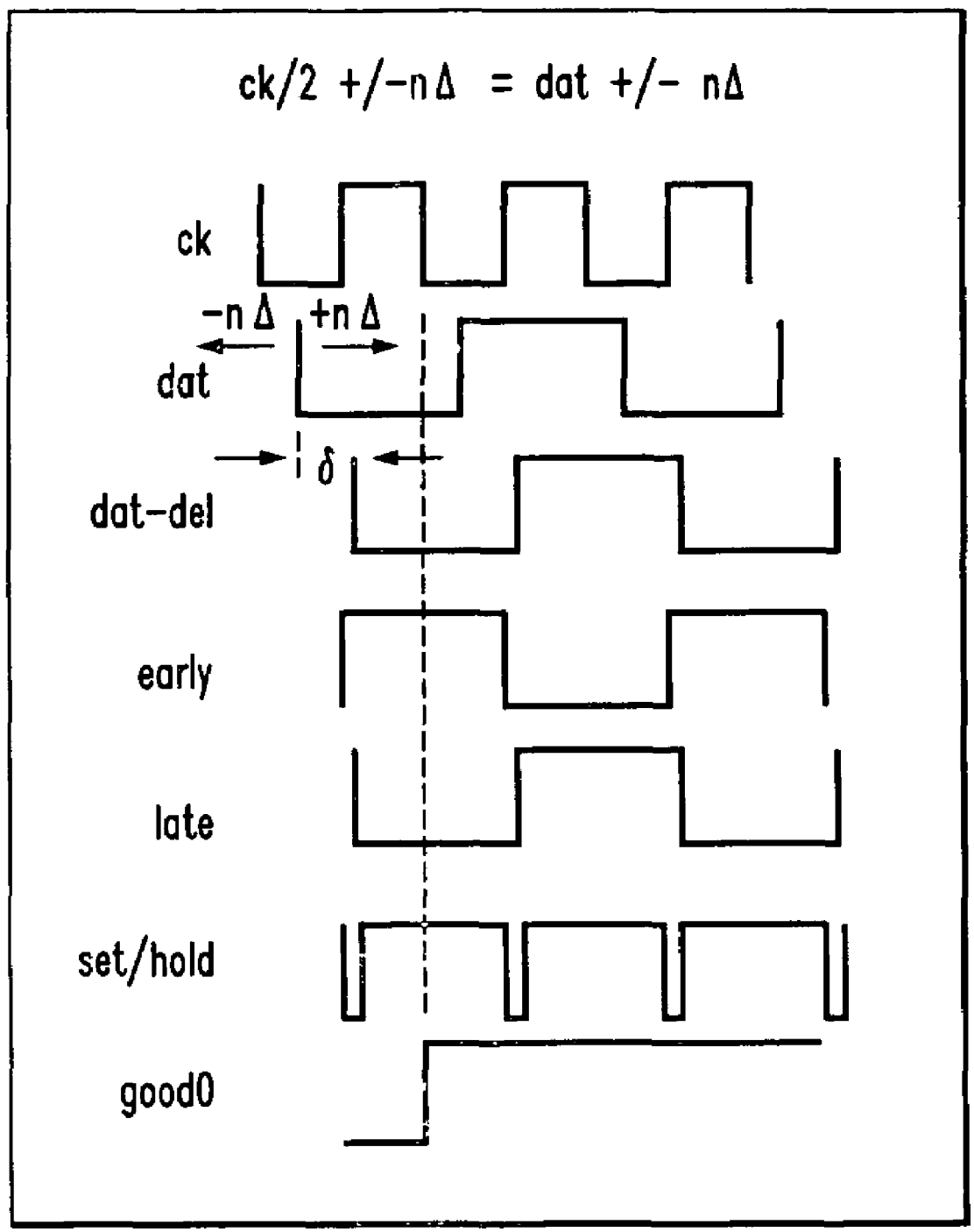
FIG. 2 is a timing diagram illustrating the operation of the FIG. 1 data capture circuit.

A corresponding timing diagram shown in FIG. 2 illustrates the relationship between a number of the signals of the FIG. 1 circuit, including a clock signal (ck), a test data signal (dat), a delayed test data signal (del-dat), selected "early" and "late" versions of the test data signal, a set/hold signal, and an output signal (good0).

The DLL 102 is an example of an element more generally referred to herein as a clock generator circuit. It generates in this embodiment the clock signal ck that is applied in uncomplemented form to clock inputs of the flip-flops D1 and D2, and is applied in complemented form to the clock input of the flip-flop D3. The flip-flops D1 and D2 are thus clocked by rising edges of the clock signal ck, while the flip-flop D3 is clocked by falling edges of the clock signal ck.

The DLL 102 also generates a divided-by-two clock signal ck/2, as well as 2n shifted versions of ck/2, each shifted by an amount +Δ or −Δ from ck/2. The clock signal ck/2 and its 2n shifted versions are each applied to one of 2n+1 inputs of the (2n+1)-to-1 multiplexer 120 as shown. The FSM 104 generates a control signal that is applied to a control signal input of the multiplexer 120 in order to select a particular one of the 2n+1 ck/2 clock signals as the test data signal dat. The FIG. 2 timing diagram shows the clock signal ck and a particular selected test data signal dat. Of course, the points at which the DLL is tapped to provide the different versions of the ck/2 clock signal can be varied in a straightforward manner in order to provide different delay relationships for selection by the FSM 104.

It will be apparent to those skilled in the art that the invention does not require the use of a DLL to perform the above-described clock generation. Numerous other types of clock generating circuitry may be used. For example, a phase lock loop (PLL) may be utilized in place of the above-noted DLL, as will be appreciated by those skilled in the art.

The FSM 104 is an example of an element more generally referred to herein as a controller. Those skilled in the art will appreciate that the functions of the FSM 104 as described herein can be implemented using other types of controllers. It should be noted that multiplexers such as multiplexers 112 and 120 may be considered part of or separate from a given controller configured in accordance with the invention.

Elements 114 and D3 collectively comprise an example comparison circuit in accordance with the invention. Of course, numerous other arrangements of circuitry may be utilized to provide this function.

The data capture circuit 100 of FIG. 1 has two modes of operation, a first or regular (R) mode, and a second or self-test (T) mode. A signal "test" generated by the FSM 104 is applied to a control signal input of each of the 2-to-1 multiplexers 112-1, 112-2, 112-3 and 112-4 and thereby controls the selection of the mode. When the test signal is at a first logic level, the regular mode is selected, and when the test signal is at a second logic level, the test mode is selected.

The regular mode corresponds to a normal operating mode of the circuit 100, and in this mode the 2-1 multiplexers 112-1, 112-2, 112-3 and 112-4 are each set to pass an R input applied thereto through to a corresponding multiplexer output. A regular or normal data signal applied to pad 110 in this mode is applied to the data input D of flip-flop D1, is clocked into D1 by the clock signal ck, and passes via the Q output of D1 and multiplexer 112-2 along its normal path to associated core circuitry (not shown). The core circuitry may be any type of logic or other processing circuitry that utilizes the regular mode data captured by D1.

In the test mode, the 2-1 multiplexers 112-1, 112-2, 112-3 and 112-4 are each set to pass the T input applied thereto through to the corresponding multiplexer output. As noted above, the FSM 104 selects a particular one of the 2n+1 ck/2 clocks generated by DLL 102 for use as the test data signal dat. The selected test data signal dat is applied to the T input of the multiplexer 112-1, and to an input of the controllable delay element 122. The FSM 104 in this embodiment also generates a control signal that is applied to the controllable delay element 122 to control the amount of delay δ provided by that element. The delayed test data signal dat-del, as indicated in FIG. 2, corresponds to the dat signal delayed by the amount δ.

The dat and dat-del signals are applied in test mode via the T inputs of the respective multiplexers 112-1 and 112-3 to the D inputs of the respective flip-flops D1 and D2. As noted previously, these flip-flops are both clocked by the clock signal ck. The flip-flops D1 and D2 generate the respective early and late signals shown in FIG. 2 and applied to first and second inputs of the XOR gate 114. The early signal represents an output generated by D1 using the undelayed input dat, while the late signal represents an output generated by D2 using the delayed input dat-del. The output of the XOR gate 114 is the signal set/hold shown in FIG. 2. The set/hold signal is applied to the D input of flip-flop D3, which as mentioned previously is clocked by the complement of the clock signal ck. The Q output of D3 is the output signal good0 that is returned to the FSM 104.

When the early and late signals differ in their logic level at a falling edge of the clock signal ck, this indicates that the particular selected delay introduced between the corresponding dat and dat-del signals by the FSM 104 led to these latter signals having different logic levels at a given rising edge of the clock signal ck, i.e., corresponding transitions in the dat and dat-del signals are on opposite sides of the clock signal rising edge. A transition in the output signal good0 indicates that the difference in the logic levels of the early and late signals exists at the falling edge of the clock signal ck. The FSM 104 continues to adjust the delay and monitor the output signal good0 in this manner until the points at which the D1 set-up and hold times are violated are known to a desired level of accuracy.

The FSM 104 in the test mode thus selects a particular amount of delay between the dat signal applied to D1 and the dat-del signal applied to D2, monitors the output signal good0 to determine if the selected delay has led D1 and D2 to generate different results, and repeats this process one or more additional times until the minimum set-up and hold time requirements of D1 are known to the desired level of accuracy. In general, the selection of a particular one of the 2n+1 ck/2 signals provides a first mechanism for adjusting the delay between dat and dat-del, and the controllable delay δ provides a second mechanism for adjusting the amount of delay between dat and dat-del.

By appropriate selection of the delay parameters δ, Δ and n, in a manner appropriate for a given application, the minimum set-up and hold time requirements of D1 can be determined to a high level of accuracy. Advantageously, the present invention allows minimum set-up and hold time requirements of a given data capture circuit to be measured to an accuracy of about +/−10 or +/−20 picoseconds, and without the expense, delay and other difficulties associated with conventional specialized test equipment. In addition, as a result of the increased accuracy, the data capture circuit may be permitted to operate with lower set-up and hold times than would otherwise be possible.

As an example, in an embodiment of the invention in which Δ is 20 picoseconds and a particular set-up and hold time window is to be determined within a range of about +/−200 picoseconds, n may be selected as 10. Similarly, if Δ is 10 picoseconds in this example, with the same +/−200 picosecond range, n may be selected as 20. The delay δ may, but need not, be selected as an integer multiple of the delay Δ, e.g., δ=Δ, 2Δ, 3Δ, 4Δ, etc.

The operation of the data capture circuit 100 in the above-noted test mode will now be described with reference to a more detailed example. Initially, it should be noted that it is well known in the art that the fine delay of a DLL can be controlled down to a level of accuracy of about 10 picoseconds. See, e.g., Xanthopoulos et al., "The design and analysis of the clock distribution network for a 1.2 GHz alpha microprocessor," ISSCC 2001, February 2001, which is incorporated by reference herein.

The present invention in the illustrative embodiments described herein can be configured to utilize this type of fine delay control to select from the DLL clock-based test data signals having particular clock edges. More particularly, assume by way of example that in the data capture circuit 100 a particular clock edge selected by multiplexer 120 under control of FSM 104, and its corresponding delayed version from element 122, are applied to the respective data inputs of the two flip-flops D1 and D2. Further assume that both flip-flops capture the same data as indicated by the signal good0 which in this case will be at a logic low level. The FSM 104 will then issue a command to select the next adjacent clock edge in 120 and will repeat the comparison of the outputs of D1 and D2. Once this test fails, that is, once the signal good0 goes to a logic high level, a set-up and hold time window has been located. The window is known at this point because FSM 104, in conjunction with element 120 which provides the selected signal dat, knows the delay of this signal with regard to the clock signal ck which is provided by the DLL 102. In addition, the width of this window will be δ as indicated by delay element 122.

The next step is to decrease the amount of delay δ in the delay element 122 and repeat the above-noted test. If the test passes, then the next adjacent clock edge in 120 is selected and the test is again repeated. This process continues until the test fails. Then the value of δ in 122 is again decreased and the process of testing, selecting another clock edge if the test passes, and retesting and reselecting until the test fails, is repeated. This search process can be done in an iterative fashion until the desired resolution, e.g., a level of accuracy on the order of +/−20 picoseconds or less, is achieved. In other words, the location of the set-up and hold time window can be determined relative to the clock signal ck with a width of δ where the location and width can be controlled, e.g., down to about +/−20 picoseconds or less.

In the current example, the actual condition that indicates the final test is complete is when the value of δ is at the desired level, e.g., 20 picoseconds or less, and the test results in the good0 signal being at a logic high level.

The values of Δ and n can be selected in a straightforward manner based on the particular clock frequency and the measurement needs of a given application.

It should be noted that the term "clock-based test data signals" is intended to be construed broadly so as to include signals directly generated by a source providing an associated clock signal, as in the illustrative embodiments, as well as other suitable signals providing the desired functionality as described herein.

Figure 3:
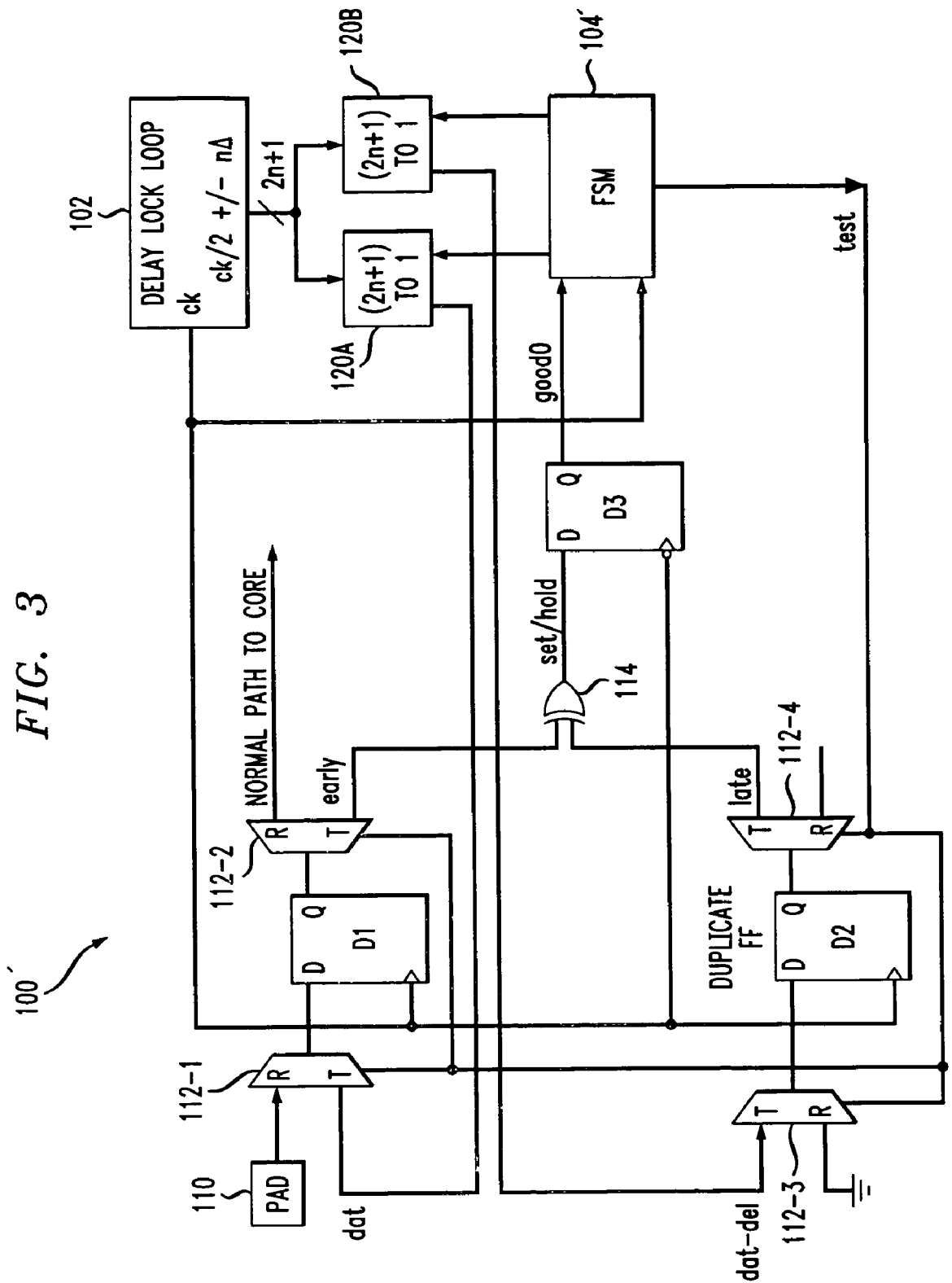
FIG. 3 shows a data capture circuit with self-test capability in accordance with a second illustrative embodiment of the invention.

FIG. 3 shows a data capture circuit 100' with self-test capability in accordance with a second illustrative embodiment of the invention. The operation of the circuit 100' is similar to that of the circuit 100 previously described in conjunction with FIGS. 1 and 2. The circuit 100' includes elements D1, D2, D3, 102, 110, 112-1, 112-2, 112-3, 112-4 and 114 configured and operating substantially as in circuit 100. However, circuit 100' eliminates the controllable delay element 122, and instead includes first and second (2n+1)-to-1 multiplexers 120A and 120B. Each of the multiplexers 120A and 120B receives the 2n+1 versions of the divided-by-two clock signal ck/2 generated by DLL 102.

The circuit 100' further includes an FSM 104' that is modified so as to provide control signals to the multiplexers 120A and 120B, rather than multiplexer 120 and delay element 122 as in the circuit 100, but otherwise operates substantially in the same manner as the FSM 104 of FIG. 1. In the test mode, the FSM selects one of the inputs of the multiplexer 120A as the test data signal dat, and one of the inputs of the multiplexer 120B as the delayed test data signal dat-del. As indicated in the timing diagram of FIG. 4, the dat and dat-del signals are preferably delayed relative to one another by an amount aΔ, where a is less than n.

Figure 4:
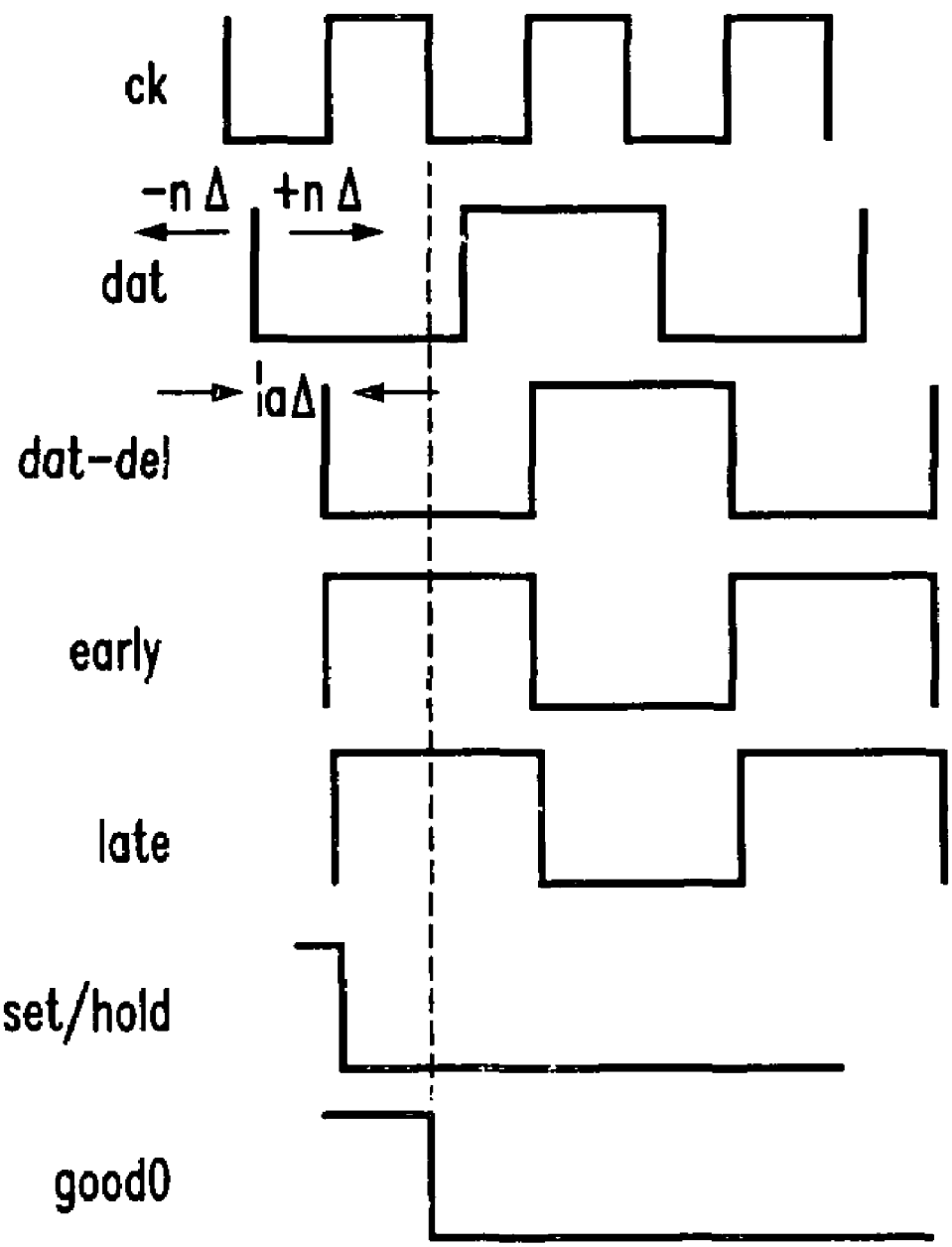
FIG. 4 is a timing diagram illustrating the operation of the FIG. 3 data capture circuit.

Also as indicated in the FIG. 4 timing diagram, the early and late signals generated by the respective flip-flops D1 and D2 are processed to generate the set/hold and good0 signals in the manner previously described. In this timing diagram, the selected delay between the dat and dat-del signals is such that corresponding transitions in both signals are on the same side of the rising edge of the clock signal ck, and thus the early and late signals have the same logic level at the falling edge of the clock signal ck, such that the good0 output signal is driven to a logic low level as shown in the diagram.

It should be noted that the circuitry associated with the test mode may be switched off, powered down or otherwise disabled when the circuit 100 or 100' is in the regular mode, so as to conserve power. For example, the elements D2, D3, 104, 112-3, 112-4, 114, 120 and 122 of circuit 100 may be disabled in the regular mode, and the elements D2, D3, 104', 112-3, 112-4, 114, 120A and 120B of circuit 100' may be disabled in the regular mode.

In addition, the above-noted elements associated with the test mode that determines minimum set-up and hold requirements for flip-flop D1 as well as other circuit elements such as DLL 102 may be used to perform similar measurements on other data capture elements of a given data capture circuit. In this manner, the area requirements associated with the test mode elements and DLL 102 may be amortized over a number of data capture elements, rather than replicated for each such element to be provided with the self-test capabilities described herein.

The measurement results, as specified by information regarding good0 signal transitions for given selected delay values, may be stored in a memory associated with the FSM 104 or 104', and read out therefrom using well-known conventional techniques. For example, one such technique may involve reading out the stored measurement results using a built-in self-test (BIST) scan path of the corresponding circuit.

It may be desirable in certain applications to repeat the measurements for different environmental conditions, e.g., different supply voltages, temperatures, etc., and to average, superimpose or otherwise process the results of these repeated measurements in order to obtain, e.g. a composite set-up and hold time window over the specified set of conditions.

It should again be emphasized that the exemplary data capture circuits described herein are intended to illustrate the operation of the invention, and therefore should not be construed as limiting the invention to any particular embodiment or group of embodiments. For example, although illustrated using flip-flops, the invention can be implemented using any other type of data capture elements. In addition, embodiments of the invention can be implemented using a wide variety of different circuit configurations to accommodate the needs of particular applications. These and numerous other alternative embodiments within the scope of the following claims will therefore be apparent to those skilled in the art.

What is claimed is:

1. A data capture circuit having a self-test capability, the data capture circuit comprising:
    at least first and second data capture elements;
    a controller for controllably selecting at least a particular one of a plurality of selectable clock-based test data signals for application to a data input of the first data capture element, a delayed version of the selected test data signal being applied to a data input of the second data capture element; and
    a comparison circuit coupled between data outputs of the first and second data capture circuits and an input of the controller, the comparison circuit being configured to compare output signals generated by the first and second data capture elements, a result of the comparison being applied to the controller input;
    wherein the controller repeats the controllable selection of particular test data signals and monitors corresponding comparison results until a clocking characteristic of at least one of the first and second data capture elements is determined to a desired level of accuracy.

2. The data capture circuit of claim 1 further comprising a clock generator circuit configured to generate (i) a clock signal for application to a clock input of the first and second data capture elements, and (ii) the plurality of selectable clock-based test data signals.

3. The data capture circuit of claim 1 wherein the first and second data capture elements comprise a pair of flip-flops.

4. The data capture circuit of claim 1 wherein the clocking characteristic comprises at least one of a set-up time and a hold time.

5. The data capture circuit of claim 2 wherein the clock generator circuit comprises a delay lock loop (DLL) having a first output corresponding to the clock signal, and a plurality of additional outputs each corresponding to one of the plurality of selectable clock-based test data signals.

6. The data capture circuit of claim 1 wherein the plurality of selectable clock-based test data signals comprise 2n+1 versions of a divided-by-two clock signal, each having a different amount of delay associated therewith.

7. The data capture circuit of claim 1 wherein the plurality of selectable clock-based test data signals are applied to corresponding inputs of a multiplexer having a control signal input coupled to an output of the controller, the controller selecting a particular one of the test data signals by application of a control signal to the control signal input of the multiplexer.

8. The data capture circuit of claim 1 further comprising a controllable delay element, the controllable delay element having a first input for receiving the selected test data signal, a second input for receiving a control signal from the controller, and an output corresponding to the delayed version of the test data signal.

9. The data capture circuit of claim 1 wherein the plurality of selectable clock-based test data signals are applied to corresponding inputs of each of a first multiplexer and a second multiplexer, each of the multiplexers having a control signal input coupled to a corresponding output of the controller, the controller selecting a particular one of the test data signals by application of a first control signal to the control signal input of the first multiplexer, and selecting the delayed version of the selected test data signal by application of a second control signal to the control signal input of the second multiplexer.

10. The data capture circuit of claim 1 wherein the controller circuit comprises a finite state machine (FSM).

11. The data capture circuit of claim 1 wherein the comparison circuit comprises (i) a logic gate having a first input adapted to receive the output signal generated by the first data capture device and a second input adapted to receive the output signal generated by the second data capture device, and (ii) a third data capture element having a data input coupled to an output of the logic gate, the third data capture element clocking data on a falling edge of the clock signal.

12. The data capture circuit of claim 1 wherein the circuit operates in a first mode in which the self-test capability is activated for application of the selected test data signal and the delayed version thereof to the respective first and second data capture elements, and a second mode in which the self-test capability is deactivated and a data signal is captured by at least one of the first and the second data capture elements.

13. An integrated circuit comprising:
    at least one data capture circuit having a self-test capability, the data capture circuit comprising:
    at least first and second data capture elements;
    a controller for controllably selecting at least a particular one of a plurality of selectable clock-based test data signals for application to a data input of the first data capture element, a delayed version of the selected test data signal being applied to a data input of the second data capture element; and
    a comparison circuit coupled between data outputs of the first and second data capture circuits and an input of the controller, the comparison circuit being configured to compare output signals generated by the first and second data capture elements, a result of the comparison being applied to the controller input;
    wherein the controller repeats the controllable selection of particular test data signals and monitors corresponding comparison results until a clocking characteristic of at least one of the first and second data capture elements is determined to a desired level of accuracy.

14. The integrated circuit of claim 13 further comprising a clock generator circuit configured to generate (i) a clock signal for application to a clock input of the first and second data capture elements, and (ii) the plurality of selectable clock-based test data signals.

15. A method of providing a self-test capability in a data capture circuit including at least first and second data capture elements, the method comprising the steps of:
    controllably selecting at least a particular one of a plurality of selectable clock-based test data signals for application to a data input of the first data capture element, a delayed version of the selected test data signal being applied to a data input of the second data capture element; and
    comparing output signals generated by the first and second data capture elements;
    wherein the selecting and comparing steps are repeated, with selection of one or more other ones of the selectable clock-based test data signals, until results of the comparing step until indicate that a clocking characteristic of at least one of the first and second data capture elements is determined to a desired level of accuracy.

* * * * *

UNITED STATES PATENT AND TRADEMARK OFFICE
CERTIFICATE OF CORRECTION

| | | |
|---|---|---|
| PATENT NO. | : 7,194,052 B2 | Page 1 of 1 |
| APPLICATION NO. | : 09/947684 | |
| DATED | : March 20, 2007 | |
| INVENTOR(S) | : T.J. Gabara | |

It is certified that error appears in the above-identified patent and that said Letters Patent is hereby corrected as shown below:

In the claims:

Claim 15, col. 10, line 24, please delete "until".

Signed and Sealed this

Eighth Day of May, 2007

JON W. DUDAS
*Director of the United States Patent and Trademark Office*